United States Patent [19]
Yamaguchi

[11] Patent Number: 5,288,586
[45] Date of Patent: * Feb. 22, 1994

[54] IMAGE-FORING PROCESS USING MICROCAPSULES

[75] Inventor: Jun Yamaguchi, Shizuoka, Japan

[73] Assignee: Fuji Photo Film Co., Ltd., Kanagawa, Japan

[*] Notice: The portion of the term of this patent subsequent to Feb. 25, 2009 has been disclaimed.

[21] Appl. No.: 717,578

[22] Filed: Jun. 19, 1991

[30] Foreign Application Priority Data

Jun. 20, 1990 [JP] Japan ................................ 2-161922
Jul. 4, 1990 [JP] Japan ................................ 2-176826
Jul. 4, 1990 [JP] Japan ................................ 2-176828

[51] Int. Cl.$^5$ ........................ G03C 1/73; G03C 7/00
[52] U.S. Cl. .................................. 430/138; 430/351; 430/353; 346/46; 355/88
[58] Field of Search ............... 430/138, 353, 336, 351, 430/203; 355/27, 88, 125; 346/46

[56] References Cited

U.S. PATENT DOCUMENTS

| | | | |
|---|---|---|---|
| 3,245,796 | 4/1966 | Borg | 430/201 |
| 3,598,583 | 8/1971 | Sprague | 430/333 |
| 4,551,407 | 11/1985 | Sanders et al. | 430/138 |
| 4,734,704 | 3/1988 | Mizutani et al. | 346/46 |
| 4,770,971 | 9/1988 | Sakai | 430/138 |
| 4,810,614 | 3/1989 | Sangyoji et al. | 430/138 |
| 4,837,106 | 6/1989 | Ishikawa et al. | 430/138 |
| 4,893,147 | 1/1990 | Tanabe et al. | 355/27 |
| 4,942,107 | 7/1990 | Saeki et al. | 430/138 |
| 4,956,251 | 9/1990 | Washizu et al. | 430/141 |
| 4,962,009 | 10/1990 | Washizu et al. | 430/337 |
| 4,985,331 | 1/1991 | Saeki et al. | 433/333 |
| 5,091,280 | 2/1992 | Yamaguchi et al. | 430/138 |
| 5,168,029 | 12/1992 | Igarashi et al. | 430/138 |

*Primary Examiner*—Charles L. Bowers, Jr.
*Assistant Examiner*—Martin J. Angebranndt
*Attorney, Agent, or Firm*—Sughrue, Mion, Zinn, Macpeak & Seas

[57] ABSTRACT

An exposure apparatus for exposing light-sensitive recording medium through a superposed image original, the exposure apparatus comprising at least one light source, an element transmissive to actinic radiation emitted from the light source positioned between the light source and the image original, the element capable of holding the image original against the heat-developable light-sensitive recording medium, and at least one interference filter disposed between the light source and the image original during exposure. The invention is further directed to an image forming process using the exposure apparatus.

7 Claims, 5 Drawing Sheets

IMAGE-FORING PROCESS USING MICROCAPSULES

FIELD OF THE INVENTION

The present invention relates to an exposure apparatus for making color or black and white proofs, slides, transparencies for overhead projectors, secondary originals, copiers, facsimiles, etc., and in particular, to an exposure apparatus for simply image-exposing a single sheet heat-developable type light-sensitive material without causing cross-talk, said light-sensitive material capable of simply obtaining color images upon heat developing after exposure (that is, without using separate single color dye transfer sheets, dye receiving sheets, etc.). The invention also relates to an image-forming process using the above-described exposure apparatus.

BACKGROUND OF THE INVENTION

For convenience, a conventional image-forming technique is explained using a color proof as an example, but almost the same concepts can be applied to other fields.

There are various systems for forming color proofs, but each system has disadvantages. As one of the typical systems for forming a color proof, there is an overlay system. In this system, multicolor images are reproduced by superposing films each having images of each primary color (e.g., red, magenta and cyan) and thus it is necessary to see images through the layers of films, which reduces the image quality.

In other system, as a system of obtaining multicolor images on one sheet, there is a surprint system. According to the system, single color images each having a primary color are successively superposed on one support sheet to form multicolor images. For example, there are known Chromarine (trade name, made by E.I. Du Pont de Nemours and Company), Match Print (trade name, made by Minesota Mining and Manufacturing Co.), Color Art (trade name, made by Fuji Photo Film Co., Ltd.), etc., but in any of these systems, 4 light-sensitive films (corresponding to each color plus grey) are required and hence waste occurs.

Furthermore, as a process for forming color images on one light-sensitive sheet, a color paper system is known. In the system, a color film original is contacted with a color photographic paper followed by exposing using each color filter and the color photographic paper is subjected to wet development to provide color images. As examples of such a system, there may be mentioned Fine Checker (trade name, made by Fuji Photo Film. Co., Ltd.) and Consensus (trade name, made by Konica Corporation). In the system, since the light-sensitive region of the color photographic paper being used is in the visible region, a dark room or an exposure apparatus equipped with a light-proof compartment is required for handling the color photographic paper. Further, the developer for use in the system must be stored and managed with specific care.

These systems have some disadvantages, for example, plural sheets are required, waste materials such as transfer sheets, toners, etc., remain, handling of light-sensitive materials in a bright room is difficult, a development system using a developer is necessary, etc., and hence improvements of the system to eliminate such disadvantages has been demanded.

As a system without having such disadvantages, the following system has been proposed.

That is, a completely dry system without waste materials can be realized by using a color image forming process which comprises using a heat-developable light-sensitive recording medium wherein latent images are formed on a light-curing composition by exposure and the components relating to coloring or discoloring are diffused in the light-sensitive material in proportion to the latent images by heating to form visible color images, the portions relating to coloring or discoloring of the uncured portions are diffused to form visible images.

There are practically many kinds of light-sensitive recording media which are used for the system and the system may be a system having a feature as a recording system of black and white images but, in particular, is useful in the case of using as a recording medium of color images.

As a practical recording medium, there is known a medium disclosed in JP-A-52-89915 (the term "JP-A" as used herein means a "unexamined published Japanese patent application"). The medium is a two-component type heat coloring medium wherein the two components, for example, an electron accepting compound and an electron donating colorless dye, are disposed inside and outside of a microcapsule containing a light-curing composition. However, in the case of this medium, even if the light-curing composition in the microcapsules is sufficiently cured, color cannot be sufficiently restrained in the cured (non-image) portion, whereby the non-imaged portions are lightly colored to tend to reduce the contrast.

As a more preferred medium causing no such coloring in the non-image portions, there is known, for example, a recording medium comprising a laminate of a layer containing a photopolymerizable composition composed of a vinyl monomer and a photopolymerization initiator, an isolating layer, and a layer composed of an electron donating colorless dye as disclosed in JP-A-61-123838. In the case of the recording medium, however, coloring of the non-imaged portion may be prevented since the thermal diffusion of the acid group scarcely occurs in the non-imaged portions, that is, the portions cured by photopolymerization.

As a process for obtaining negative images by the same system, there is, for example, a process disclosed in JP-A-60-119552. In the process, a recording medium is used wherein a photopolymerizable composition composed of a monomer or a prepolymor capable of bleaching a dye and a dye capable of being bleached by the monomer or the prepolymer are disposed isolately from each other. However, the recording medium has the similar disadvantages to the medium described above.

As the most preferred medium overcoming the problems of coloring and the low image density at the non-imaged portions, there is a recording medium described in European Patent Publication No. 412,570A2 by the same applicant. In the recording medium, one of two components of the two-component type heat-sensitive coloring medium is enclosed in microcapsules and the other component is disposed outside the microcapsules as a curing compound of a light-curing composition or together with a light-curing composition.

A recording medium for negative images using the same technical concept as above is proposed in European Patent Publication No. 412,570A2 by the same applicant. In the recording medium, a photopolymerizable composition containing an electron accepting compound and a polymerizable vinyl monomer is disposed in a layer outside microcapsules and microcapsules containing an electron donating colorless dye are disposed in the layer.

For practicing color recording using such a light-sensitive recording medium as described above, fundamentally, a recording medium having plural light sensitive layers each having sensitivity to a different light wavelength and a different coloring hue may be used. As examples of a more preferred recording medium, there are the recording media described in European Patent Publication No. 412,570A2. For example, there is a multicolor recording medium comprising a support having laminated thereon plural light-sensitive layers each being sensitive to light of a different wavelength and each coloring to a different hue, wherein the layer structure from an exposure light source side to the support side of the recording medium is successively composed of a first light-sensitive layer being sensitive to light having a central wavelength $\lambda 1$, an interlayer absorbing light having the central wavelength $\lambda 1$, a second light-sensitive layer being sensitive to light having a central wavelength $\lambda 2$ and coloring to a color different from the color of the 1 st light-sensitive layer, an interlayer absorbing the light having the central wavelength $\lambda(i-1)$, and an (i)th light-sensitive layer being sensitive to light having a central wavelength $\lambda 1$ and coloring to a color different from the colors of the 1st, 2nd,—(i−1)th light-sensitive layers, and the central wavelength being $\lambda 1\ \lambda 2 < - < \lambda i$, wherein, i is an integer of at least 2.

Since the light-sensitive recording medium is of a monosheet type, if the central wavelength $\lambda i$ is set to a visible region, the medium becomes a recording medium absorbing visible light and hence the recording medium is colored overall. Accordingly, it is preferred that the central wavelength is in an ultraviolet region.

That is, in the case of a color light-sensitive recording medium having a cyan coloring layer, a magenta coloring layer, and a yellow coloring layer, it is preferred that they have three kinds of central wavelengths in an ultraviolet region. Thus, in the case of exposing such a light-sensitive material, it is preferred to use an exposure apparatus having a wavelength region as broad as possible in the ultraviolet region.

That is, in the broad wavelength region, it is preferred that the recording medium has three kinds of central wavelengths in the region of 330 nm as the lower limit, which is the short wavelength limit of light transmitting through a pressing glass of an exposure apparatus or a lithographic original, and 430 nm as the upper limit, which is allowable for coloring of the recording medium that is, over a region of about 100 nm.

However, the pressing glass of a commercially available exposure apparatus for printing is a glass which is so-called blue plate glass and hence the glass does not sufficiently transmit light having a wavelength of lower than 340 nm due to the light absorption by impurities contained in the glass. Accordingly, it is necessary to set independent three light-sensitive regions in the narrow region of substantially from 340 nm to 400 nm (even if slight coloring may be allowed, the region of from 340 nm to 420 nm), but by the common sense in the field of the art, it is very difficult to substantially divide this narrow region into the three regions.

In particular, it is difficult to obtain a monochromatic light source exposing each coloring layer only.

The narrowness of the region causes a problem that in a dichromatic light recording medium or a monochromatic light recording medium, the light sensitivity is lowered. For example, if one attempts to divide the above region of about 100 nm in the single light source into three regions using filters, an undesirable phenomenon known as cross-talk occurs. That is, for example, in the case of image-exposing the region of $\lambda 2$, the component light of $\lambda 1$ and/or $\lambda 3$ of light from the $\lambda 2$ light source passing through the filters exposes other regions or layers than the light sensitive layer for $\lambda 2$. Thus, if the light-sensitive recording medium thus exposed is developed, color images are formed having a color different from the color expected from the original.

Furthermore, after exposing these light sensitive recording media, heat development is necessary for stabilizing the images formed and thus exposing and heat developing apparatus capable of easily performing the heat development step have been desired.

SUMMARY OF THE INVENTION

An object of the present invention is to provide an exposure apparatus for a completely dry black and white or color light-sensitive recording medium without giving unnecessary waste materials such as supports, etc., and without need of using a developer, etc., and also an image forming process using the exposure apparatus.

Another object of this invention is to provide an image-forming process capable of obtaining clear images having no color mixing among colors by a light exposure of a short time and also an exposure apparatus suitably used for the image-forming process.

Still another object of this invention is to provide an exposure and heat development apparatus capable of easily carrying out the heat development after exposure and an image-forming process using the apparatus.

It has now been discovered that the objects described above can be achieved by the present invention as described hereinbelow.

That is, according to the first embodiment of the present invention, there is provided an exposure apparatus for exposing at least light-sensitive recording medium through a superposed image original, wherein the exposure apparatus comprising: at least one light source; an element transmissive to actinic radiation emitted from the light source positioned between the light source and the image original, the element capable of holding the image original against the light-sensitive recording medium; and at least one interference filter disposed between the light source and the image original during exposure.

Also, according to a second embodiment of the present invention, there is provided a process for forming an image in a heat-developable light-sensitive recording medium, wherein the heat-developable light-sensitive recording medium comprising at least one layer capable of imagewise curing upon imagewise exposure to actinic radiation to form a latent image and thereafter capable of forming a color image by heating to cause movement of components relating to coloring or decoloring in the light-sensitive material in correspondence or counter-correspondence to the latent image, in which the process comprising the steps of:

superposing an image original against said heat-developable light-sensitive recording medium;

placing the superposed image original and heat-developable light-sensitive recording medium in an exposure apparatus comprising: at least one light source; an element transmissive to actinic radiation emitted from said light source positioned between said light source and said image original, said element holding said image original against said heat-developable light-sensitive recording medium; and at least one interference filter disposed between said light source and said image original during exposure;

exposing said heat-developable light sensitive recording medium to actinic radiation emitted from said light source and passing through said interference filter, said transmissive element and said original to form a latent image in said heat developable light-sensitive recording medium; and heating said exposed heat-developable light-sensitive recording medium to form an image.

In the aforesaid exposure apparatus of the present invention, it is preferred to use a glass or a polyester film having the transmittance of at least 60% in the wavelength region of from 340 nm to 450 nm for holding the image original and the recording medium.

Furthermore, in the exposure and heat development apparatus, which is used for heat development thereafter, it is preferred that the exposure portion is disposed adjacent to the heat development portion.

DETAILED DESCRIPTION OF THE INVENTION

Figure 1:
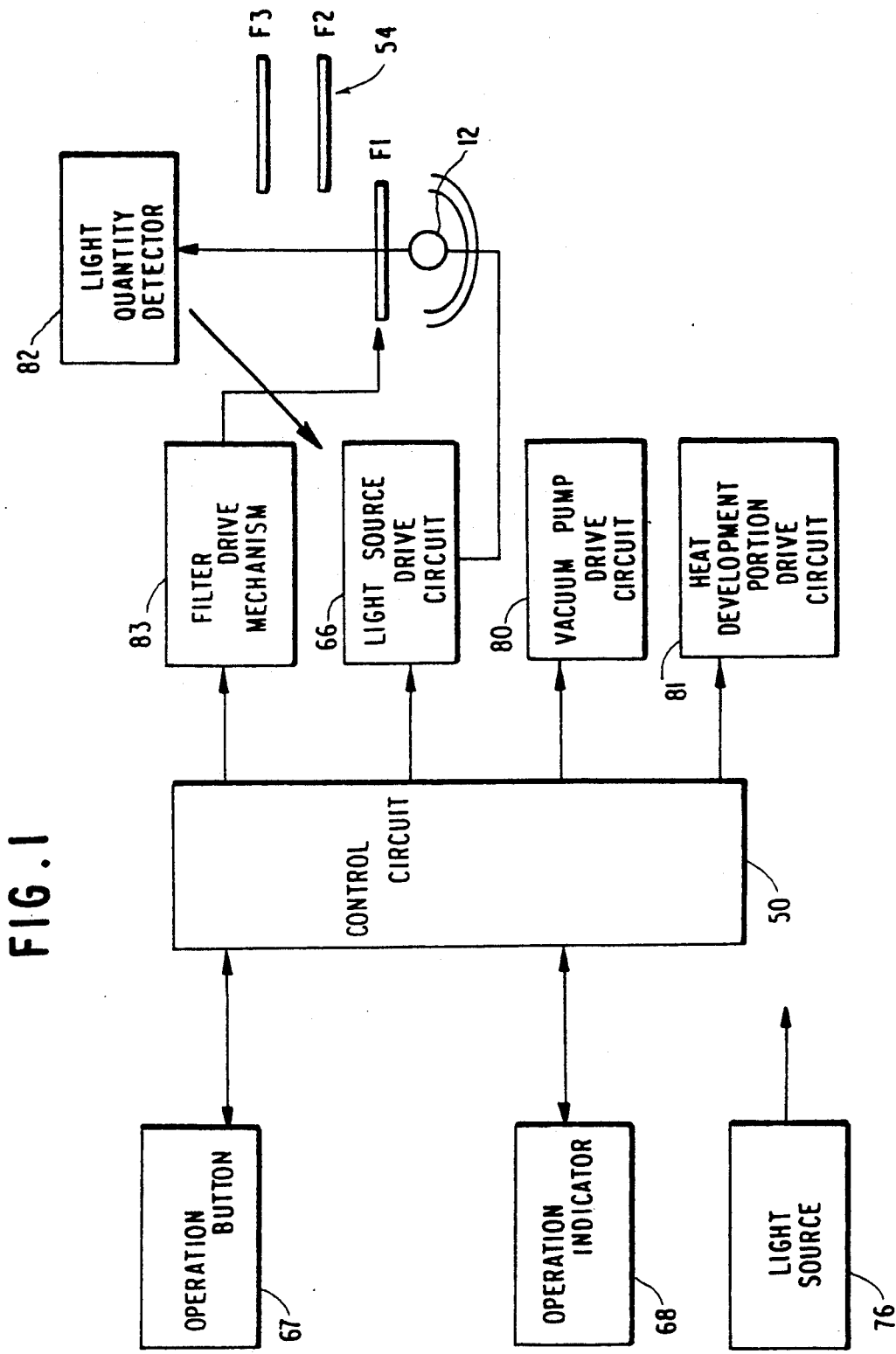
FIG. 1 is a schematic view showing an example of a circuit constitution of the exposure apparatus of the present invention.

A feature of the exposure apparatus of the present invention is the use of an interference filter and as the interference filter which can be preferably used in this invention, there are a metal interference filter such as, for example, MIF-W Type Filter (trade name, made by Nippon Shinku Kogaku K.K.), an all dielectric interference filter such as, for example, DIF Type Filter (trade name, made by Nippon Shinku Kogaku K.K.), Dichroic Filter (trade name, made by Nippon Shinku Kogyo K.K.), etc., and they can be used singly or as a combination thereof.

Also, the filter may be in various forms such as a plate form, a disk form, a cylindrical form, a hemispherical form, etc. In particular, in the case of an interference filter, the cut-off wavelength is changed by the angle formed by transmitting light and the filter face and hence it is preferred that the exposure apparatus comprises means for preventing or minimizing change of the cut-off wavelength. For example, in the case of using a point light source, it is preferred to use a hemispherical filter or an interference filter having a curved surface for correcting the discrepancy of the wavelength by the angle with transmitting light. Also, an interference filter wherein the discrepancy of wavelength is corrected by changing the thickness of the film may be used.

The interference film filter may be combined with a film-form filter containing a known dye or a color glass filter and also a part of the interference filter may be replaced with the aforesaid filter.

As a film-form filter containing a dye, which can be used as a dye filter, there is, for example, SC41 Filter (trade name, made by Fuji Photo Film Co., Ltd.) and as a glass filter containing a dye, there is, for example, L-42. Filter (trade name, made by Toshiba Glass K.K.).

For color exposure, it is preferred to use, for example, only an interference filter or to use a sharp cut filter cutting light of the short wavelength region such as, for example, SC41 Filter (trade name, made by Fuji Photo Film Co., Ltd.) for the exposure of a long wavelength layer and a band pass filter such as, for example, Metal Interference Filter (trade name, made by Nippon Shinku Kogaku K.K.) for the exposure of an intermediate wavelength layer.

Also, in the exposure apparatus of the present invention, it is preferred to use a material having a large transmittance in the ultraviolet region as a holding plate (e.g., a glass or a polyester) for facilitating the division of wavelength and in particular, it is preferred to use a material selected from an oxide glass and a polyester film the transmittance of which over the wavelength region of from 340 nm to 450 nm is at least 60%. As the oxide glass, there are, for example, quartz glass, Pyrex glass (trade name, made by Dow Corning Co.), IWAKI CODE 7740 glass (trade name, made by Iwaki Glass K.K.), DURAN GLASS (trade name, made by SCHOTT Co.), Hario-32 Glass (trade name, made by Shibata Kagaku KIKI Kogyo K.K.), Museum Glass (trade name, made by Asahi Glass Co., Ltd.), etc. In these glasses, Museum Glass is most preferable in the point of economy. Further, from viewpoint of industrial acquisition of a glass having a large area used for a printer, a blue plate glass, etc., is preferably used.

Figure 3:
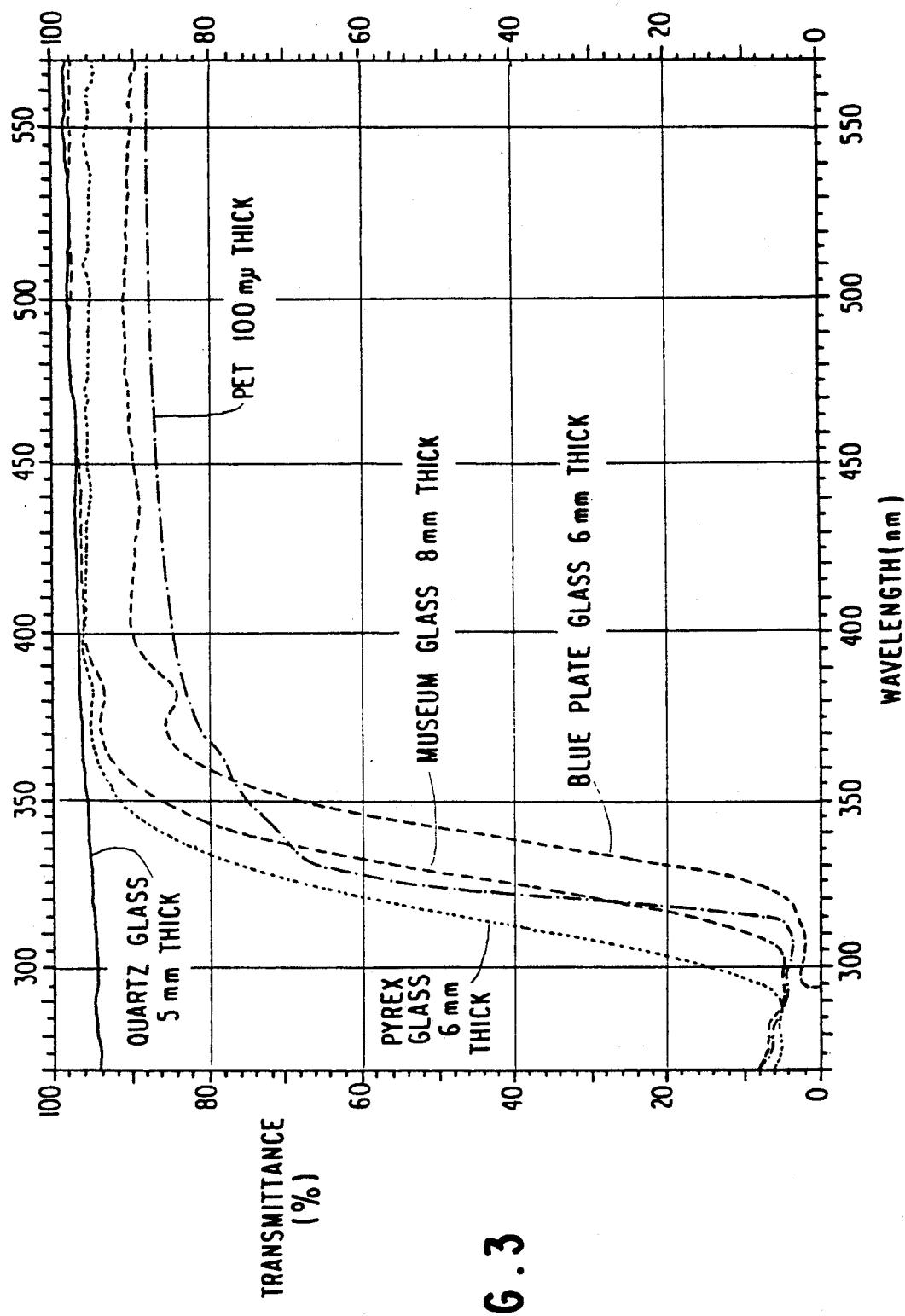
FIG. 3 is a graph showing the transmittance of a glass which can be used in the exposure apparatus of the present invention.

In FIG. 3 of the accompanying drawings, transmission spectra of the materials which can be preferably used in this invention are shown together with that of a blue plate glass.

As the thickness of the glass plate is thinner, the light permeability is higher and from this view point, a thinner thickness is advantageous but if the thickness becomes too thin, the mechanical strength of the glass plate is lowered. Thus, taking into consideration the mechanical strength, the thickness of the glass plate is preferably from 4 mm to 10 mm, and more preferably from 5 mm to 8 mm.

In the image-forming process of this invention, an image original is placed on a heat-developable light-sensitive recording medium comprising a light-curing composition by imagewise exposure and the components relating to coloring or decoloring are caused to diffuse in the light-sensitive material in proportion to the latent images to form color images, image exposing the light-sensitive recording medium using the exposure apparatus wherein an interference filter is disposed between the light source and the image original to polymerize a monomer at the exposed portions with a photopolymerization initiator, and the recording medium after exposure is heated to cause diffusion of the components relating to coloring or decoloring in the uncured portions to form visible images.

In this case, it is preferred that in the exposure apparatus, a material selected from an oxide glass plate and a polyester film, the transmittance of which in the wavelength region of from 340 nm to 450 nm is at least 60%, is used for holding or pressing the image original against the light-sensitive recording medium.

Figure 2:
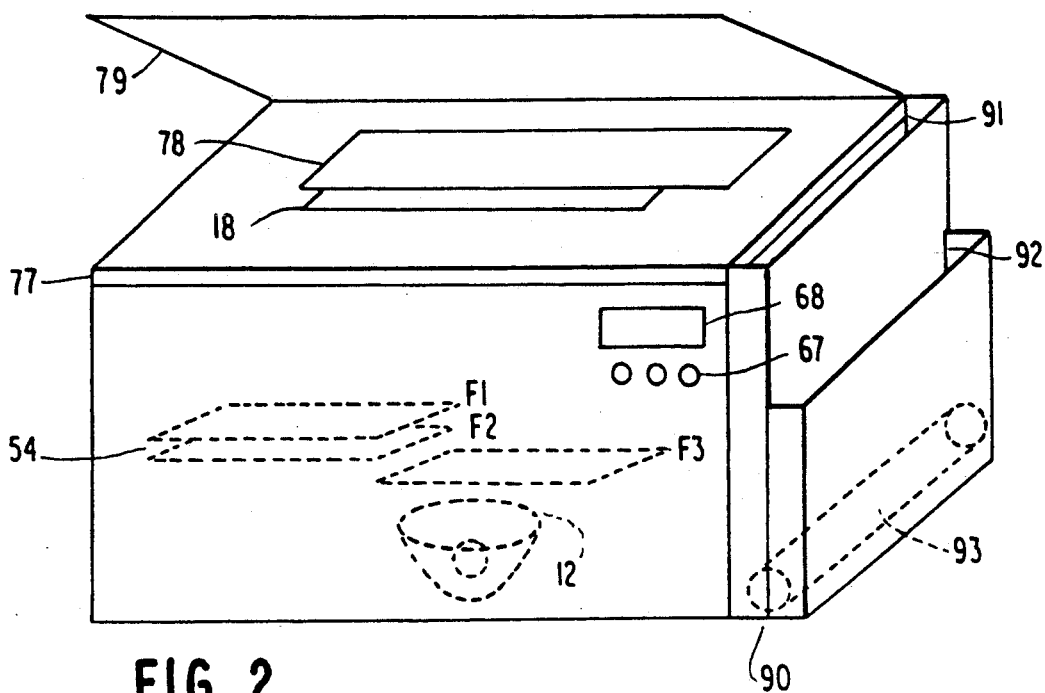
FIG. 2 is a schematic slant view showing an example of the exposure apparatus of the present invention.

FIG. 2 shows an example of the exposure apparatus of this invention. In the apparatus shown in FIG. 2, as a heating method being used for the heat developing portion 90, a method known as a heat fixing method for fixing a toner in electrophotography, such as a non-contact heating method as heating by radiation heat, etc., or a contact type heating method using a hot plate or a hot roller, etc., and a known method using a heat-treating apparatus as described in JU-A-1-172047, JU-A-1-172037, JU-A-1-172046 and JU-A-1-172048 (the term "JU-A" as used herein means an "an examined published Japanese Utility model application"), an apparatus for heat development of a dry silver can be preferably used.

In these heating methods, a heating method using a hot roller 93 is most preferred. For heating the hot roller, a method heating nichrome wire by passing an electric current, a method firing a burner in the inside of the roller, a method placing a heating material such as a halogen lamp, etc., in the inside of the roller, a method using a roller surface of which is heated by passing electric current, etc., can be employed.

As the material for the hot roller 93, a metal such as iron, aluminum, stainless steel, etc. is preferred and the surface thereof may be subjected to a specular finish treatment, coated with Teflon, or may be subjected to a flocking treatment.

Also, the surface of the hot roller is preferably controlled at a constant temperature and it is preferred that the hot roller has one or more temperature sensors in the inside thereof to make the temperature distribution as uniform as possible.

Furthermore, it is preferred that the temperature of the hot roller and the rotation rate of the hot roller can be easily changed according to the intended use and the circumstances.

The light-sensitive layer of the recording medium of this invention is composed of, for example, a binder, an electron donating colorless dye contained in microcapsules, and liquid drops disposed outside the microcapsules. The liquid drops are composed of a compound having an electron accepting portion and a polymerizable vinyl monomer portion in the same molecule and a photopolymerization initiator. In the exposed portions of the light-sensitive layer, photopolymerization of the polymerizable electron accepting compound by the photopolymerization initiator occurs. As the result thereof, the electron accepting compound is light-cured and becomes immobile, thereby when the light-sensitive layer is heated, the electron accepting compound cannot diffuse into the microcapsule and be brought into contact with the electron donating colorless dye and thus causes no coloring.

On the other hand, it is considered that when the electron accepting compound is heated at the unexposed portions, the compound diffuses through the microcapsule walls and is brought into contact with the electron donating colorless dye to color the electron donating colorless dye and to give positive images.

In this invention, a recording medium having negative working light-sensitive layer(s) may be used.

In the case of a negative working recording medium, the light sensitive layer is preferably composed of a binder, an electron donating colorless dye contained in microcapsules and liquid drops disposed outside the microcapsules. The liquid drop is composed of a polymerizable vinyl monomer having a property of decoloring a dye colored by the reaction of the electron accepting compound and an electron donating compound and a photopolymerization initiator. In the exposed portions of the light-sensitive layer, photopolymerization of the decoloring vinyl monomer occurs by the action of the photopolymerization initiator and becomes immobile. In the exposed portions of the light-sensitive layer, the electron accepting compound is brought into contact with the electron donating colorless dye by heating to cause coloring. On the other hand, it is considered that in the unexposed portions, when the decoloring vinyl monomer is heated, the monomer passes through the microcapsule walls to decolor the dye colored by the contact of the electron donating colorless dye and the electron accepting compound to give negative images.

As the recording medium which can be advantageously exposed by the exposure apparatus of this invention, there are various kinds of recording media, such as a monochromatic recording medium, a dichromatic recording medium, a functional color recording medium, a full color recording medium, etc.

In a multicolor recording medium, plural light-sensitive layers each sensitive to light of a different wavelength and coloring to a different hue are formed on a same support. In the case of exposing the light-sensitive layers, plural exposure apparatus each having a filter corresponding to the respective wavelength sensitivity are prepared and the light sensitive layers can be successively exposed using the plural exposure apparatus, but it is preferred to use one exposure apparatus having plural filters and equipped with a function of successively changing the filter per exposure.

For example, in such a multicolor recording medium, the layer structure of the recording medium having plural light-sensitive layers each sensitive to light of a different wavelength and each coloring to a different hue is composed of, from the exposure light source side to the support side of the recording medium, a first light-sensitive layer sensitive to light having a central wavelength $\lambda 1$, an interlayer absorbing light having the central wavelength $\lambda 1$, a second light sensitive layer sensitive to light having a central wavelength $\lambda 2$ and coloring a color different from the color of the first light-sensitive layer—, an interlayer absorbing light having the central wavelength $\lambda(i-1)$, and an (i)th light-sensitive layer sensitive to light having a central wavelength $\lambda 1$ coloring to a color different from the colors of the first, second,—(i−1)th light sensitive layers, and these central wavelengths are $\lambda 1 < \lambda 2 — < \lambda i$, wherein i is an integer of at least 2.

Then, the exposure apparatus of this invention is explained by referring to the accompanying drawings. As an example of the heat-developable light-sensitive recording medium which can be advantageously exposed or exposed and developed by the exposure apparatus of this invention, a full color recording medium coloring to cyan, magenta, and yellow is explained.

Figure 5:
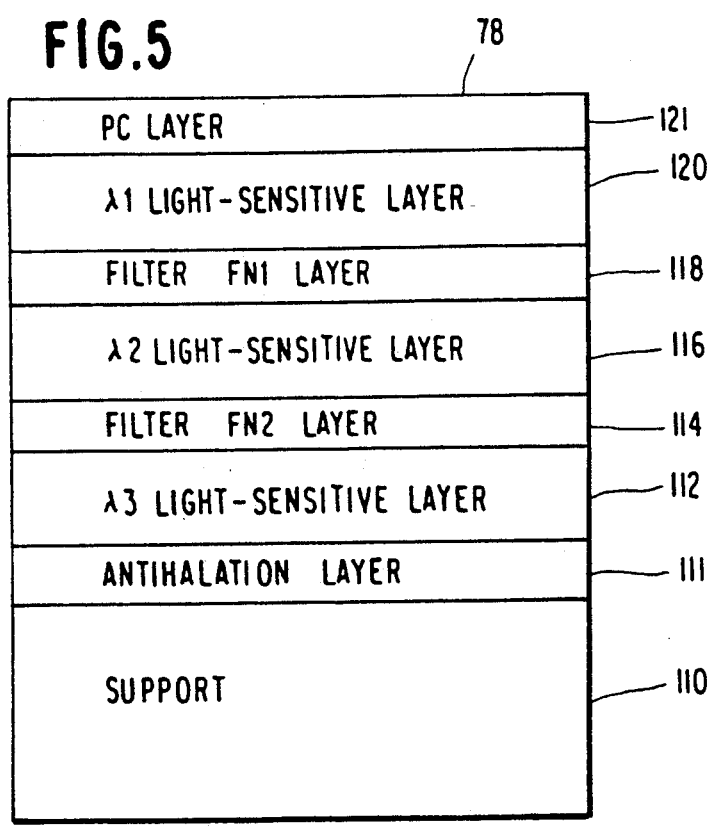
FIG. 5 is a schematic view showing an example of the layer structure of heat-developable light-sensitive recording medium which is used in the image forming process of the present invention.

FIG. 5 is a schematic view showing the layer structure of the recording medium 78.

In FIG. 5, a $\lambda 3$ light-sensitive layer 112 is a light-sensitive layer sensitive to light having a central wavelength $\lambda 3$. Similarly, a $\lambda 2$ light-sensitive layer 116 is a light-sensitive layer sensitive to light having a central wavelength $\lambda 2$ and $\lambda 1$ light-sensitive layer 120 is a light-sensitive layer sensitive to light having a central wavelength $\lambda 1$. Numerals 114 and 118 are filter layers each absorbing light having central wavelength $\lambda 2$ or $\lambda 1$, respectively.

FIG. 1 and FIG. 2 show an example of the exposure and heat development apparatus for use in this invention.

In the exposure heat development apparatus, four of the so-called color separated lithographic original films corresponding to C (cyan), M (magenta), Y (yellow), and BK (black) are used. After color exposing a recording medium 78 by exposing each light-sensitive layer coloring C, M or Y by light having a wavelength corresponding to the sensitive wavelength of each light-sensitive layer through an original 18 composed of the BK original film and one of the other three color original films, in turn, superposed thereon and a filter selected from a filter group 54, the recording medium is heat developed.

In the case of the recording medium for use in this invention, by developing the recording medium 78 by heating after exposure, a full color image can be easily obtained.

In addition, filters F3, F2, and F1 are interference filters each passing light having a central wavelength $\lambda 3$, $\lambda 2$, or $\lambda 1$, respectively, only.

The protocol for recording color images using the recording medium 78 by the exposure apparatus of this invention is now explained based on FIG. 2 and FIG. 5.

First, light passed through filter F1 having a central wavelength $\lambda 1$ passes through a glass 77 and a corresponding image original 18 and reaches a light-sensitive recording medium 78, whereby the $\lambda 1$ light-sensitive layer 120 is exposed. In this case, light having other central wavelengths than the central wavelength $\lambda 1$ is cut by the filter F1, and the $\lambda 2$ light-sensitive layer 116 and the $\lambda 3$ light-sensitive layer 112 are not exposed by the light.

In the portions of the $\lambda 1$ light-sensitive layer 120 exposed in conformity with the image original 18, the photopolymerization of the polymerizable electron accepting compound 208 occurs by the photopolymerization initiator as described above, whereby the electron accepting compound 208 is light cured to become immobile.

Then, the light of a central wavelength $\lambda 2$ which passed through a filter F2 passes through the image original 18 to expose the light-sensitive recording medium 78. The $\lambda 1$ light-sensitive layer 120 is not exposed by the light and the $\lambda 2$ light-sensitive layer 116 is exposed by the light of the central wavelength $\lambda 2$. In this case, since light of other wavelengths than light of the central wavelength $\lambda 2$ is cut by the filter F2, the $\lambda 3$ light-sensitive layer 112 is not exposed.

In exposed portions of the $\lambda 2$ light sensitive layer 116 exposed, the photopolymerization of the polymerizable electron accepting compound 208 occurs by the photopolymerization initiator similar to the above $\lambda 1$ light-sensitive layer, whereby the electron accepting compound 208 is cured and becomes immobile.

Finally, the light of a central wavelength $\lambda 3$ passed through a filter F3 passes through the image original 18 and exposes the recording medium 78. In this case, the $\lambda 1$ light-sensitive layer 120 and the $\lambda 2$ light-sensitive layer 116 are not sensitive to the light of the central wavelength $\lambda 3$ and the $\lambda 3$ light sensitive layer 112 only is exposed by the light.

By the exposure as described above, in the portions of each light-sensitive layer exposed in conformity with the image 18, the photopolymerization of each polymerizable electron accepting compound occurs by the photopolymerization initiator as described above, whereby the electron accepting compound is light cured and becomes immobile. In the thus exposed portions of each light-sensitive layer, the electron accepting compound cannot be brought into contact with the electron donating colorless dye by heating and thus the dye cannot be colored.

On the other hand, it is considered that in the unexposed portions, when the electron accepting compound is heated, the compound passes through the microcapsule walls and is brought into contact with the electron donating colorless dye to cause a color forming reaction in the electron donating colorless dye and to give positive images.

Figure 7:
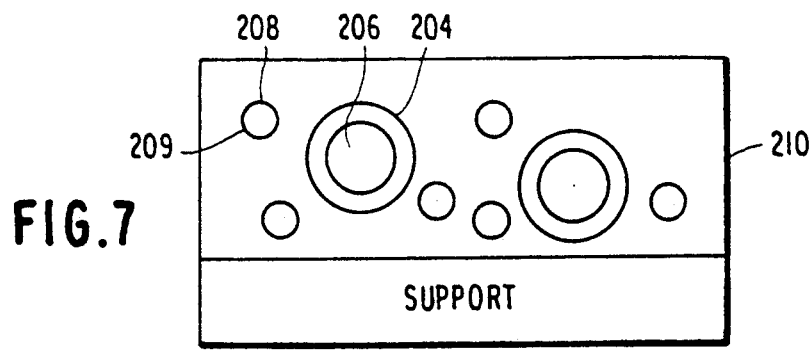
FIG. 7 is a schematic view of a positive working light-sensitive layer.

FIG. 7 is a schematic view showing a positive working light-sensitive layer. The layer is composed of a binder 210, an electron donating colorless dye 206 contained in a microcapsule 204, and a liquid drop 209 disposed outside the microcapsules 204. The liquid drop 209 is composed of a compound 208 having an electron accepting moiety and a polymerizable vinyl monomer moiety in the same molecule and a photopolymerization initiator. In the exposed portions of the light-sensitive medium, photopolymerization of the polymerizable electron accepting compound 208 occurs by the photopolymerization initiator and the electron accepting compound 208 is thus light cured and becomes immobile, thereby when the recording medium is heated, the electron accepting compound 208 cannot be brought into contact with the electron donating colorless dye 206 and thus the dye cannot be colored. On the other hand, in the unexposed portions, when the electron accepting compound 208 is heated, the compound passes through microcapsule walls and are brought into contact with the electron donating colorless dye 206 to color the electron donating colorless dye 206 and to give positive images.

By the manner as described above, each of the $\lambda 3$ light-sensitive layer 112, the $\lambda 2$ light sensitive layer 116 and the $\lambda 1$ light-sensitive layer 120 colors in each color component to give full color images.

Also, in place of the recording medium giving positive images, the above-described negative working recording medium may be used.

Figure 8:
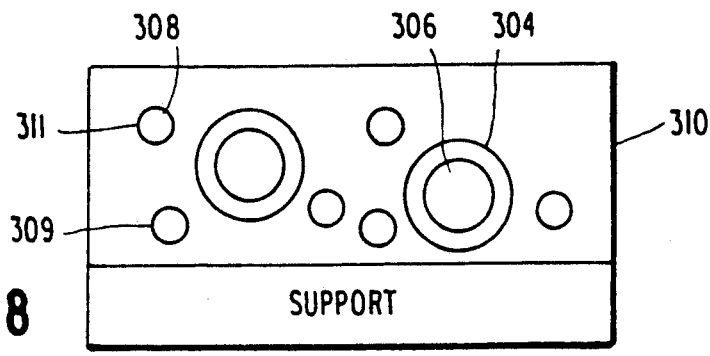
FIG. 8 is a schematic view showing a negative working light-sensitive layer.

In the case of negative working light-sensitive layers, as shown in FIG. 8 as a schematic view, the light-sensitive layer is composed of a binder 310, and electron donating colorless dye 306 contained in a microcapsule 304, and liquid drops 309 disposed outside the microcapsules 304. The liquid drop 309 is composed of an electron accepting compound 308, a polymerizable vinyl monomer 311 having a property of decoloring the dye colored by the reaction of the electron donating colorless dye 306 and the electron accepting compound 308, and a photopolymerization initiator. In the exposed portions of the recording medium, photopolymerization of the decoloring vinyl monomer 311 occurs by the photopolymerization initiator and the vinyl monomer 311 becomes immobile. When the recording medium is heated, the electron accepting compound 308 is brought into contact with the electron donating colorless dye 306 to cause coloring. On the other hand, in the unexposed portions, when the decoloring vinyl monomer 311 is heated, the vinyl monomer passes through microcapsule walls to decolor the dye colored by the contact of the electron donating colorless dye 306 and the electron accepting compound 308 and to give negative images.

Then, examples of the exposure apparatus and image-forming process of this invention are explained in detail by referring to the accompanying drawings, but the invention is not limited to them.

EXAMPLE 1

Exposure Apparatus:

FIG. 1 is a block view showing an example of the circuit construction of the exposure apparatus, and FIG. 2 shows the construction of the apparatus.

An operation button 67 has a function of selecting each interference filter corresponding to each desired light-sensitive layer from an interference filter group 54 composed of filters Fl, F2, and F3, a function of closely contacting an original 18 and a light-sensitive recording medium 78 placed between a glass plate 77 and a holding (or pressing) plate 79 by evacuating the space between the glass plate 77 and the holding plate 79, a function of, thereafter, exposing the light-sensitive recording medium 78 by energizing a light source 12 at a definite time, and a function of, after finishing the light exposure, releasing the vacuum and, at the same time, removing the selected filter from the upper portion of the light source to finish a series of a monochromatic exposure operations.

On an operation indicating portion 68 are indicated the selected filter, operation time, etc.

If necessary, many kinds of operation buttons may be employed. For example, various buttons such as a C button for a cyan image exposure, and M button for a magenta image exposure, a Y button for a yellow image exposure, a BK button for BK image exposure in the case of a negative working light-sensitive recording medium, an F button for exposure without filter, etc., may be provided.

It is preferred that the operation button memorizes the selection of each filter for exposure, the time of evacuation for closely contacting an original and a light-sensitive recording medium, the electric power supplied to the light source (intensity of the light source), etc.

A light source 12 is the type of emitting ultraviolet light or visible light of the region near ultraviolet light containing wavelengths λ1, λ2, λ3. When the above-described light-sensitive recording medium 78 is exposed by the light, light of a desired wavelength is separated by the filter selected from the filter group 54. In addition, three light sources are disposed and each of ultraviolet lights or visible lights having wavelengths λ1, λ2, and λ3 may be emitted from each light source.

As the light source 12, a super high pressure mercury lamp, a high pressure mercury lamp, a metal halide lamp, a semiconductor laser, an electronic flash (xenon lamp), a tungsten lamp, an argon laser, a helium cadmium laser, a fluorescent lamp, etc., can be used, but from among these light sources, a mercury lamp, in particular, a high frequency wave driving mercury lamp is particularly preferable owing to the intense shortwave light.

The light source 12 is driven by a light source driving circuit 66 under control of a controlling circuit 50.

There is no particular restriction on the position of the light source and if the light source, the filter, the original, and the light-sensitive recording medium are disposed in this order, the light source may be disposed at the upper portion or lower portion of the light-sensitive recording medium.

In addition, three light sources are disposed and light of wavelength λ1, λ2 or λ3 may be emitted from each of the light sources.

FIG. 2 is a schematic view showing an exposure apparatus using Museum Glass as a glass 77.

Figure 4:
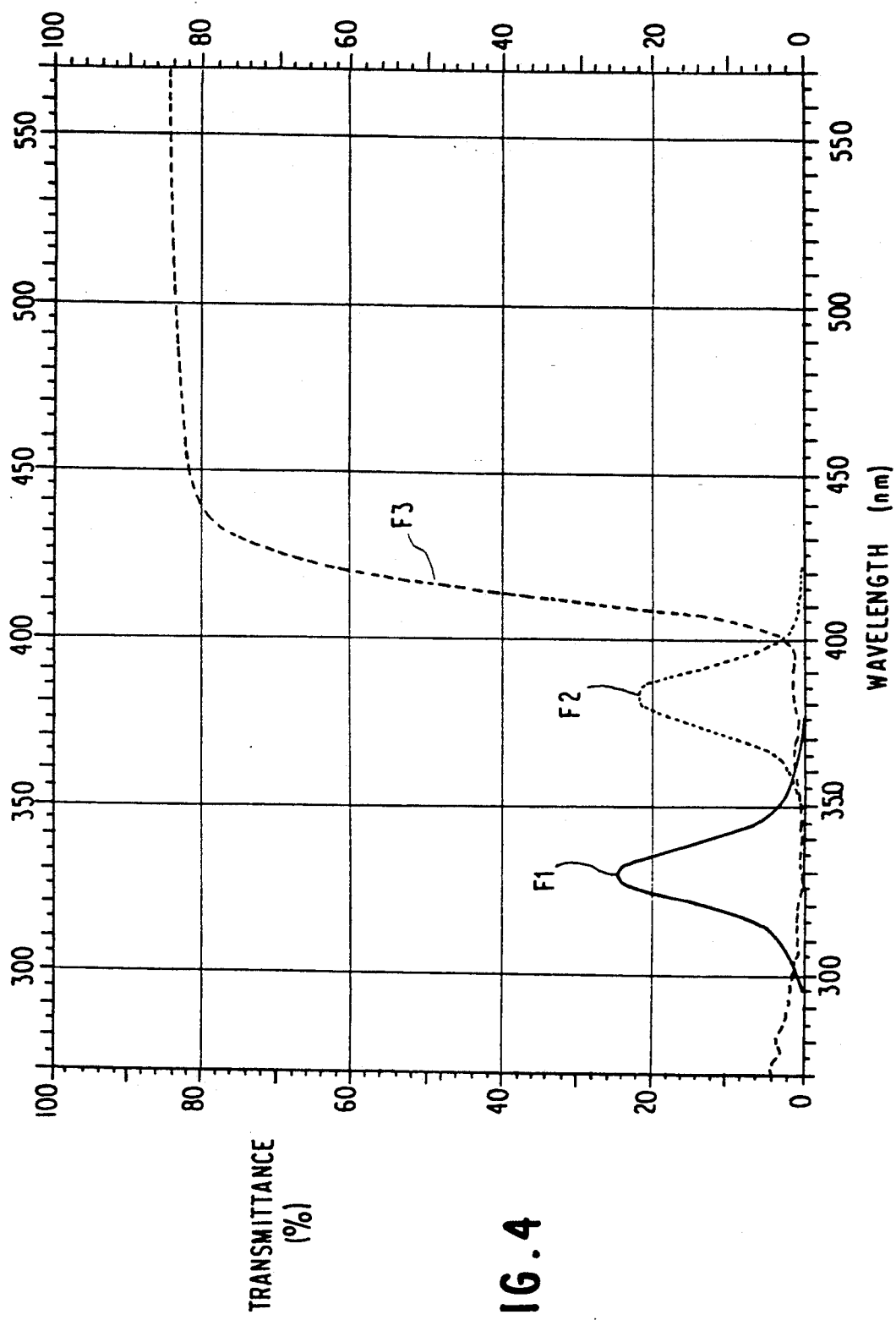
FIG. 4 is a graph showing the transmittance of an interference filter which can be preferably used in the exposure apparatus of the present invention.

FIG. 4 shows examples of filters F1, F2 and F3, each having a desired central wavelength and as the filter group 54. Of these filters, a film-form filter containing a dye, e.g., SC41 Filter (trade name, made by Fuji Photo Film Co., Ltd.), a glass filter containing a dye, e.g., L-42 Filter (trade name, made by Toshiba Glass K.K.), a metal interference filter, e.g., MIF-W Type (trade name, made by Nippon Shinku Kogaku K.K.), a dielectric interference filter, e.g., DIF Filter (trade name, made by Nippon Shinku Kogaku K.K.), Dichroic Filter (trade name, made by Nippon Shinku Kogaku K.K.), etc., can be used singly or as a combination thereof.

In FIG. 2, a high developing portion 90 of the apparatus has an inlet 91 for setting a light-sensitive recording medium therein and an outlet 92 for taking out the light-sensitive medium therefrom. It is preferable that a transport roller or a transport belt for ensuring the transport of the light-sensitive recording medium is provided between the inlet 91 and the outlet 92.

In addition, the form of the above-described filter may be various ones such as a plate form, a disk form, a cylindrical form, a hemispherical form, etc.

EXAMPLE 2

Figure 6:
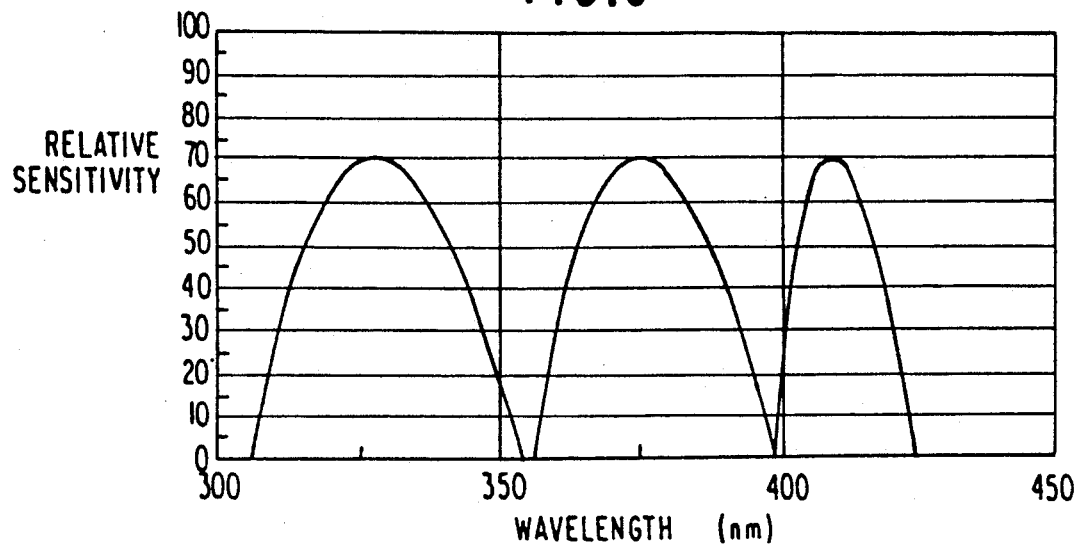
FIG. 6 is a graph showing the photosensitive characteristics of each light sensitive layer of the heat-developable light-sensitive recording medium shown in FIG. 5.

Image-Forming Process:

By using Museum Glass (trade name, made by Asahi Glass Co., Ltd.) having a transmission spectrum shown in FIG. 3 as the glass 77 holding the original and the light-sensitive recording medium, using vapor-deposited film interference filters shown in FIG. 4 as filters, such as, practically, using MIF-W Type Filter of central wavelength 328 nm (trade name, made by Nippon Shinku Kogaku K.K.) as an F1 filter, MIF-W Type filter of central wavelength 383 nm (trade name, made by Nippon Shinku Kogaku K.K.) as an F2 filter, and SC41 Filter (trade name, made by Fuji Photo Film Co., Ltd.) as an F3 filter; using a positive working light-sensitive recording medium having the photosensitive characteristics shown in FIG. 6 as a light-sensitive recording medium; and using AEL light source of 6 kW (made by Fusion Co.) as a light source 12, exposures of C, M, and Y were applied. For the exposures of C, M, and Y, the exposure times shown in Table 1 were required.

After exposure, a light-sensitive recording medium was supplied from the inlet 91, heat developed for 5 seconds by means of a hot roller 93 of 120° C., and took out from the outlet 92, whereby clear images having no cross-talk were obtained.

EXAMPLE 3

Image Forming Process:

By following the same procedure as Example 2 except that a blue plate glass was used in place of Museum Glass used in Example 2, clear full color image were obtained. In this case, the exposure times shown in Table 1 below were required for the exposures of C, M, and Y layers.

TABLE 1

| | Exposure times required | | | |
|---|---|---|---|---|
| Example No. | C Layer Exposure Time (sec.) | M Layer Exposure Time (sec.) | Y Layer Exposure Time (sec.) | Total Exposure Time (sec.) |
| Example 2 | 20 | 30 | 70 | 120 |
| Example 3 | 20 | 30 | 200 | 250 |

While the invention has been described in detail and with reference to specific embodiments thereof, it will be apparent to one skilled in the art that various changes and modifications can be made therein without departing from the spirit and scope thereof.

What is claimed is:

1. A process of forming an image in a heat-developable light-sensitive recording medium, said heat-developable light-sensitive recording medium comprising at least one layer containing a light-sensitive composition capable of imagewise curing upon imagewise exposure to actinic radiation to form a latent image and thereafter capable of forming a color image in respective correspondence or counter-correspondence to said latent image in the light-sensitive material by heating to cause movement of components relating to coloring or decoloring, said process comprising the steps of:
  superposing an image original against said heat-developable light-sensitive recording medium;
  placing the superposed image original and heat-developable light-sensitive recording medium in an exposure apparatus comprising:
    at least one light source;
    an element transmissive to actinic radiation emitted from said light source positioned between said light source and said image original, said element holding said image original against said heat-developable light-sensitive recording medium; and
    at least one interference filter disposed between said light source and said image original during exposure;
  exposing said heat-developable light-sensitive recording medium to actinic radiation emitted from said light source and passing through said interference filter, said transmissive element and said original to form a latent image in said heat-developable light-sensitive recording medium; and
  heating said exposed heat-developable light-sensitive recording medium;
wherein the heat-developable light-sensitive recording medium comprises microcapsules which include an electron donative colorless dye, and a light-curable composition outside said microcapsules which includes an electron acceptive compound and which forms latent images by imagewise exposure, said heat-developable light-sensitive recording medium forming color images in counter-correspondence to said latent images by heating to move said electron acceptive compound.

2. The image-forming process of claim 1, wherein said transmissive element for holding said image original against said heat developable light-sensitive recording medium is selected from the group consisting of a glass and polyester film having a transmittance over the region of from 340 nm to 450 nm of at least 60%.

3. The image-forming process of claim 1, wherein said exposure apparatus is provided with a heating element for heating said heat-developable light-sensitive recording medium after exposure.

4. The image-forming process of claim 1, wherein said light curing composition containing a compound has an electron acceptive moiety and a polymerizable vinyl monomer moiety in a same molecule and a photopolymerization initiator.

5. The image-forming process of claim 1, wherein said heat-developable light-sensitive recording medium has laminated on a support at least two light-sensitive layers and interlayers in the order of, from the exposure light source side to the support side of the light-sensitive recording medium, a first light-sensitive layer sensitive to light having a central wavelength $\lambda 1$, an interlayer absorbing the light having the central wavelength $\lambda 1$, a second light-sensitive layer sensitive to light having a central wavelength $\lambda 2$ and coloring to a color different from the color of the first light-sensitive layer, an interlayer absorbing light of a central wavelength $\lambda 2$, an interlayer absorbing light of a central wavelength $\lambda(i-1)$, and an (i)th light-sensitive layer sensitive to light having a central wavelength $\lambda i$ and coloring a color different from the colors of the first light-sensitive layer, the second light-sensitive layer, and the $(i-1)$th light-sensitive layer, and the central wavelengths are $\lambda 1 < \lambda 2 < - < \lambda i$, wherein i is an integer of at least 2.

6. The image-forming process of claim 5, wherein said i=3 and the central wavelengths $\lambda 1$, $\lambda 2$ and $\lambda 3$ of said heat-developable light-sensitive recording medium are at least 320 nm, the central wavelengths $\lambda 1$ and $\lambda 2$ are less than 400 nm, and the central wavelength $\lambda 3$ is at least 400 nm, wherein $\lambda 1 < \lambda 2 < \lambda 3$.

7. A process of forming an image in a heat-developable light-sensitive recording medium, said heat-developable light-sensitive recording medium comprising at least one layer containing a light-sensitive composition capable of imagewise curing upon imagewise exposure to actinic radiation to form a latent image and thereafter capable of forming a color image in correspondence to said latent image in the light-sensitive material by heating to cause movement of a component relating to decoloring, said process comprising the steps of:
  superposing an image original against said heat-developable light-sensitive recording medium;
  placing the superposed image original and heat-developable light-sensitive recording medium in an exposure apparatus comprising:
    at least one light source;
    an element transmissive to actinic radiation emitted from said light source positioned between said light source and said image original, said element holding said image original against said heat-developable light-sensitive recording medium; and at least one interference filter disposed between said light source and said image original during exposure;

exposing said heat-developable light-sensitive recording medium to actinic radiation emitted from said light source and passing through said interference filter, said transmissive element and said original to form a latent image in said heat-developable light-sensitive recording medium; and heating said exposed heat-developable light-sensitive recording medium;

wherein the heat-developable light-sensitive recording medium comprises an electron acceptive component, microcapsules which include an electron donative colorless dye, and a light-curable composition outside said microcapsules which includes a vinyl monomer and which forms latent images by imagewise exposure, said heat-developable light-sensitive recording medium forming color images in correspondence to said latent images by heating to move at least said vinyl monomer.

* * * * *